United States Patent [19]
Tsu et al.

[11] Patent Number: 5,972,769
[45] Date of Patent: Oct. 26, 1999

[54] SELF-ALIGNED MULTIPLE CROWN STORAGE CAPACITOR AND METHOD OF FORMATION

[75] Inventors: Robert Yung-Hsi Tsu, Plano; Jing Shu, Richardson, both of Tex.; Isamu Asano, Iruma, Japan; Jeffrey Alan McKee, Grapevine, Tex.

[73] Assignee: Texas Instruments Incoporated, Dallas, Tex.

[21] Appl. No.: 08/993,637

[22] Filed: Dec. 18, 1997

Related U.S. Application Data

[60] Provisional application No. 60/033,722, Dec. 20, 1996.

[51] Int. Cl.$^6$ .................................................. H01L 21/20
[52] U.S. Cl. ........................................ 438/396; 438/253
[58] Field of Search ................................... 438/253, 254, 438/396, 397

[56] References Cited

U.S. PATENT DOCUMENTS

| | | | |
|---|---|---|---|
| 5,266,512 | 11/1993 | Kirsch | 438/396 |
| 5,491,103 | 2/1996 | Ahn et al. | 437/52 |
| 5,508,222 | 4/1996 | Sakao | 437/60 |
| 5,516,719 | 5/1996 | Ryou | 437/60 |
| 5,521,112 | 5/1996 | Tseng | 437/52 |
| 5,545,582 | 8/1996 | Roh | 437/52 |
| 5,550,076 | 8/1996 | Chen | 438/396 |
| 5,550,077 | 8/1996 | Tseng et al. | 437/52 |
| 5,620,918 | 4/1997 | Kondoh | 438/396 |
| 5,726,086 | 3/1998 | Wu | 438/253 |
| 5,789,291 | 4/1998 | Sung | 438/397 |
| 5,807,775 | 9/1998 | Tseng | 438/253 |
| 5,811,331 | 9/1998 | Ying et al. | 438/396 |
| 5,849,619 | 12/1998 | Cho et al. | 438/397 |
| 5,863,821 | 1/1999 | Chao | 438/253 |

OTHER PUBLICATIONS

Multilayer Vertical Stakced Capacitors (MVSTC) for 64Mbit and 256Mbit DRAMS, D. Temmler, pp. 13–14.

*Primary Examiner*—Kevin M. Picardat
*Attorney, Agent, or Firm*—Robby T. Holland; Carlton H. Hoel; Richard L. Donaldson

[57] ABSTRACT

A self-aligned multiple crown storage cell structure 10 for use in a semiconductor memory device and method of formation that provide a storage capacitor with increased capacitance. A double crown storage cell structure embodiment 10 can be formed by patterning a contact via 18 into a planarized base layer that can include an insulating layer 12, an etch stop layer 14, and a hard mask layer 16, depositing a first conductive layer 20, etching the first conductive layer 20, etching the hard mask layer 16, depositing a second conductive layer 24 onto the conductive material-coated patterned via 18 and the etch stop layer 14, depositing a sacrificial (oxide) layer 26 onto the second conductive layer 24, etching the sacrificial layer 26, depositing a third conductive layer 28, and etching conductive material and the remaining sacrificial layer 26. The last several steps can be repeated to form a storage cell structure 10 with three or more crowns.

10 Claims, 4 Drawing Sheets

SELF-ALIGNED MULTIPLE CROWN STORAGE CAPACITOR AND METHOD OF FORMATION

This is a Non Provisional application filed under 35 USC 119(e) and claims priority of prior provisional, Ser. No. 60/033,722 of inventor Tsu, et al, filed Dec. 20, 1996.

TECHNICAL FIELD OF THE INVENTION

The present invention relates generally to semiconductor devices and methods of manufacture, and more particularly, to a self-aligned multiple crown storage cell for use in memory devices, and the method of forming a self-aligned multiple crown storage cell.

BACKGROUND OF THE INVENTION

It is a generally desirable goal in semiconductor fabrication to reduce the size of semiconductor devices. This holds true for semiconductor memory devices such as Dynamic Random Access Memory (DRAM) devices. As semiconductor memory device dimensions continue to shrink, and the corresponding density continues to increase by a 4x rule, the storage cell gets increasingly smaller while the required storage charge remains about the same. Conventional oxynitride (N/O or O/N/O) dielectrics have a relatively low capacitance per unit area (~7.7 fF/um2, for an effective oxide thickness of 4.5 nm) that limits the storage capacity because of potential high tunneling leakage. To combat this problem, various area enhancement technique have been proposed, including hemispherical grain (HSG) rugged poly, disks, fins, and corrugated cylindrical cell (CCC). However, these area enhancement techniques have inherent limitations.

The HSG technique requires complicated deposition processes within a narrow temperature window. Storage cells that incorporate fins, disks, and CCC formations are primarily composed of multiple horizontal fins. As the storage cell size is further decreased, the fins add less surface area than vertical sidewalls. Furthermore, the typical fin-type structure fabrication is not a robust manufacturing process, and results in a storage cell that is less mechanically stable, especially during oxide removal between horizontal fins and particle removal.

In another attempt to overcome the limitations of conventional oxynitride dielectrics, high dielectric constant materials, including $Ta_2O_5$, $Ba_{1-x}Sr_xTiO_3$ (BST), $SrTiO_3$, and $Pb_{1-x}Zr_xTiO_3$ (PZT), have been proposed as storage dielectrics due to their high capacitance per unit area. The high capacitance per unit area could theoretically allow use of a simple stacked cell storage cell structure. However, high dielectric constant materials are new to semiconductor fabrication and several obstacles exist to implementation in semiconductor fabrication, including contamination to transistors, robust deposition process development, etching of the new materials, integration experience, and reliability.

SUMMARY OF THE INVENTION

The present invention provides a semiconductor memory device storage cell system and method of fabrication that substantially eliminates or reduces disadvantages and problems associated with conventional storage cell systems and methods of fabrication.

More specifically, the present invention provides a self-aligned multiple crown storage cell structure for use in a semiconductor memory device and a method of forming the self-aligned multiple crown storage cell that provides a storage capacitor with increased capacitance. One embodiment of the storage cell structure can be formed by patterning a contact via into a planarized insulating layer/etch stop layer/hard mask layer stack-up and depositing a first conductive layer. The first conductive layer and the hard mask layer are etched to form the first crown and associated first crown base. A second conductive layer is deposited onto the conductive material-coated patterned via and the etch stop layer, and an oxide layer is deposited onto the second conductive layer. The oxide layer is etched, and a third conductive layer is deposited. The conductive material can be etched to expose the etch stop layer, and the remaining oxide layer is etched to form the second crown in a double crown embodiment of the storage cell stricture.

By repeating the above steps of depositing a second conductive layer onto the conductive material-coated patterned via and the etch stop layer, depositing an oxide layer onto the second conductive layer, etching the oxide layer, depositing a third conductive layer, etching conductive to expose the etch stop layer, and etching the remaining oxide layer, additional crowns can be formed to provide a three or more crowned storage cell structure.

The self-aligned semiconductor storage cell of the present invention provides the technical advantage of an increased surface area by forming multiple crowns during the manufacturing process. The increased surface area allows an increased storage capacitance as compared to conventional storage cells of comparable size.

The present invention provides several manufacturing advantages. By using a via formation, the multiple crown formation of the storage cell is truly self-aligned, thereby eliminating one photo mask step in forming the storage cell. The simplified process flow of forming the crowns from an initial via also saves polysilicon via formation. The formation process of the present invention is also compatible with simple crown processes and rugged poly formation processes. These manufacturing advantages reduce the complexity and cost of manufacturing the storage cell.

The multiple crown storage cell formed according to the teachings of the present invention incorporates a structure having the crown base of each crown contained within a via. This structure provides an improved mechanical stability both during manufacture and upon final formation. The structure is also easily expandable to allow increasing numbers of crowns within a relatively small cell structure.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

The self-aligned multiple crown storage cell of the present invention is formed using a dielectric for use in semiconductor devices, including 256 Mb and 1 Gb DRAMs. The multiple crown storage cell can be formed using dielectric constant materials such as N/O, O/N/O, $Ta_2O_5$, BST, and PZT, as well as other relatively high dielectric constant materials. The multiple crown storage cell structure formation methodology of the present invention enables forming a self-aligned storage cell of a defined size while eliminating one photo patterning (SN patterning) step. The present invention provides a more robust storage cell formation process and a storage cell structure with superior mechanical stability.

FIGS. 1–11 illustrate the self-aligned multiple crown storage cell formation process flow for a double crown storage cell structure. It should be understood, however, that the formation methodology of the present invention can provide a storage cell having three or more crowns. By reducing the via size, polysilicon thickness, and crown spacing, it is possible to build a multiple crown storage cell having three or more crown formations within approximately the same memory array surface area. It should be further understood that the self-aligned storage cell fabrication process of the present invention can be used to form a single crown cell by modifying the process flow to eliminate the storage node (SN) patterning step.

Figure 1:
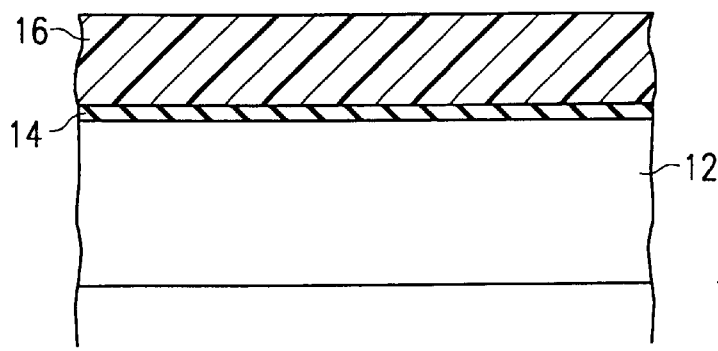
FIG. 1 illustrates a planar deposition of an etch stop layer/hard mask layer stack-up onto an insulating layer.

FIG. 1 shows a memory cell planarizing layer 12, that can comprise an insulating material such as an oxide formed by the decomposition of tetraethyloxylance (TEOS oxide) or boron phosphate silicate glass (BPSG), having a relatively thin etch stop layer 14 deposited onto the planarizing layer 12, and a relatively thick hard mask layer 16 deposited onto the etch stop layer 14. The hard mask layer 16 is a first sacrificial layer. The etch stop and hard mask layers 14 and 16 may be deposited using a sputtering or chemical vapor deposition (CVD) process. The etch stop layer 14 is used as an etch stop when etching the hard mask layer 16. The etch stop layer 14 can comprise various insulating materials including $Si_3N_4$, while the hard mask layer 16 can comprise various masking materials including oxides (e.g., doped or undoped $SiO_2$), TiN, and spun-on-glass (SOG). For the exemplary multiple crown storage capacitor and formation methodology shown in FIGS. 1–6, the etch stop layer 14 comprises $Si_3N_4$ and the hard mask layer 16 comprises a TEOS oxide.

Figure 2:
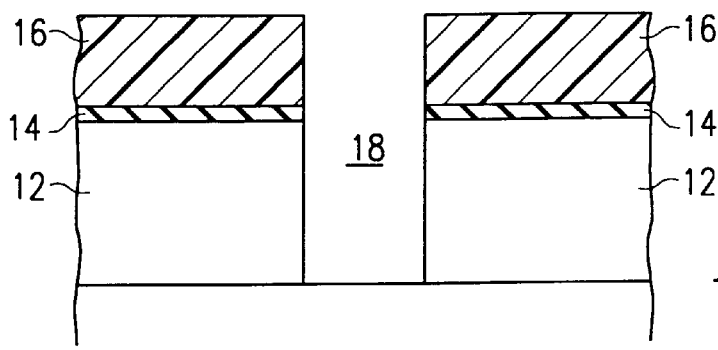
FIG. 2 shows a formation of a via area within the insulating layer/etch stop layer/hard mask layer stack-up of FIG. 1.

As shown in FIG. 2, a storage node via 18 is patterned to expose a contact within the semiconductor layer 10. The approximately cylindrical cross-section via 18 has a varying height according to the various heights of the planarizing, etch stop, and hard mask layers in order to fit the storage node (SN) shape after the self-aligned cell formation. The combined thickness of the hard mask layer 16 and etch stop layer 14 is determined according to the storage cell crown height desired. One exemplary set of the multiple crown storage cell formation parameters is listed in Table 1.

TABLE 1

Self-Aligned Multiple Crown Cell Capacitance Calculation

| 256M DRAM Storage Cel Dimension (VERTICAL DIMENSIONS) | SN width | = | 0.38 μm |
|---|---|---|---|
| | SN length | = | 0.92 μm |
| | SN space (after photopatterning and etch) | = | 0.24 μm |

| Parameter settings for making the storage cell (unit = μm) | | |
|---|---|---|
| SN–SN horizontal separation | = SNH | = 0.1 |
| SN–SN vertical separation | = SNV | = 0.1 |
| SN via patterning width | = pw | = 0.24 |
| SN via patterning length | = pl | = 0.78 |
| SN width | = SNW | = 0.52 |
| SN length | = SNL | = 1.06 |
| Conductive material thickness | = t | = 0.05 |
| Crown spacing | = cs | = 0.04 |
| SN height | = h | (below) |
| Via depth | = pd | = 0.6 |
| Via width | = pw | = 0.24 |
| Via length | = pl | = 0.78 |

| | | NO Dielectric Teff | |
|---|---|---|---|
| | | 4.5 nm | 3.0 nm |
| SN height(μm) | Surface Area (μm²) | Cs(fF) | |
| 0.20 | 2.38 | 18.25 | 27.38 |
| 0.30 | 3.16 | 24.27 | 36.41 |

TABLE 1-continued

| | | | |
|---|---|---|---|
| 0.40 | 3.94 | 30.29 | 45.44 |
| 0.50 | 4.73 | 36.31 | 54.46 |
| 0.60 | 5.51 | 42.33 | 63.49 |
| 0.70 | 6.30 | 48.35 | 72.52 |
| 0.80 | 7.08 | 54.37 | 81.55 |
| 0.90 | 7.86 | 60.39 | 90.58 |
| 1.00 | 8.65 | 66.40 | 99.61 | where, $$\text{Surface area} = p(pw+2cs+2t)(pw/4+cs/2+t/2+h) + p(pw-2t)(h+pd-t) + 2p(h-2t)(pw+cs) + (pl-pw)(pw+2cs+8h+2pd-8t).$$

Due to the reduced via width of the present invention as compared to a regular round via, a self-aligned via etch step should preferably be used. This self-aligned SN etch requires no additional photo patterning steps, because the conductive layer etching will define and isolate the storage node.

Figure 3:
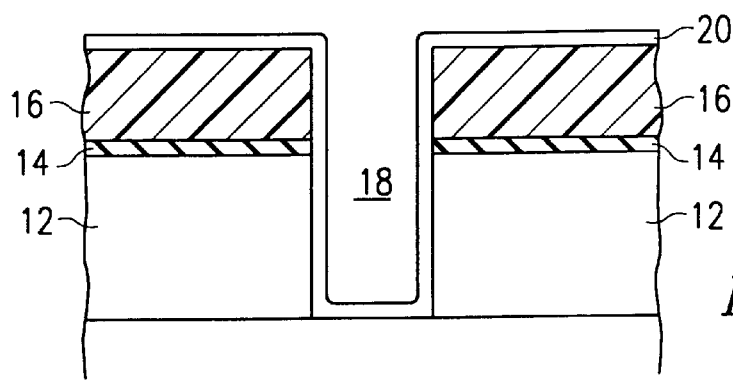
FIG. 3 shows the deposition of a conductive layer to pattern a storage node via in the structure of FIG. 2.

After the via 18 is patterned and anisotropically etched, a conductive material, such as an in-situ P-doped (ISD) polysilicon, is deposited along the inner surface of the via 18 and onto the surface of the hard mask layer 16 to form a first conductive layer 20, as shown in FIG. 3. The first conductive layer 20 covers the side walls of via 18 to extend down into via 18, as shown in FIG. 3. Each successive conductive layer described by the process of the present invention to form a multiple crown storage cell structure can comprise an ISD polysilicon deposited using either a CVD or plasma-CVD deposition process.

Figure 4:
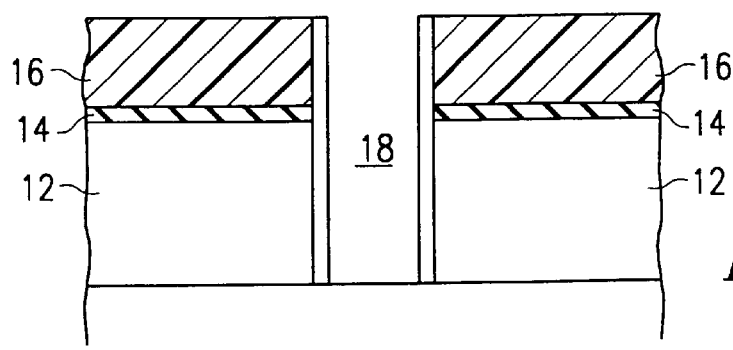
FIG. 4 shows the structure of FIG. 3 after a conductive material etching.
Figure 5:
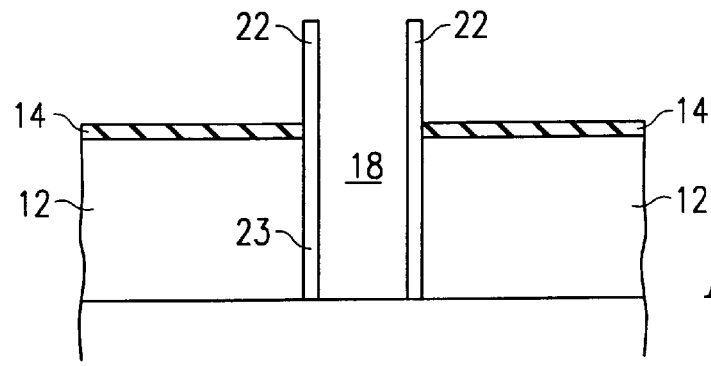
FIG. 5 shows the structure of FIG. 4 after a hard mask etching to form a first crown of a multiple crown storage cell according to the present invention.

The first conductive layer 20 is etched back using an appropriate etch as shown in FIG. 4, resulting in conductive layer 20 remaining on the vertical side walls of via 18. An etch to remove the hard mask layer 16 follows, as indicated in FIG. 5. The process steps shown in FIGS. 3, 4 and 5 result in the formation of the first crown 22 and first crown base 23 of the storage cell. As shown in FIG. 5, first crown base 23 is formed within the via 18 area, while the first crown 22 extends above the via 18. First crown 22 forms an approximately cylindrical extension from first crown base 23 above via 18. Forming first crown base 23 within the via 18 gives the first crown 22 added mechanical stability.

Figure 6:
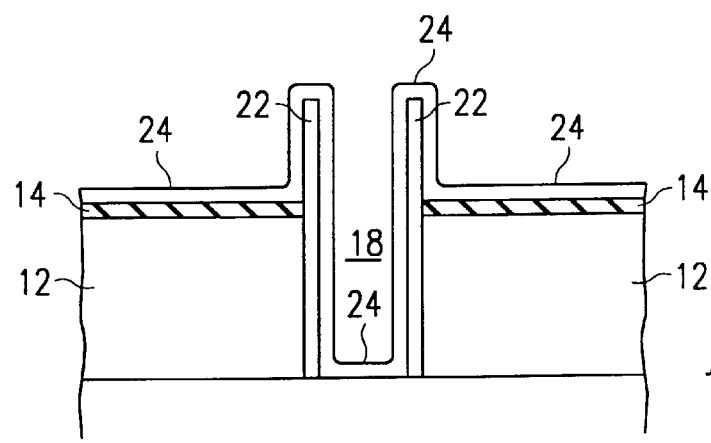
FIG. 6 shows the growth of a second conductive layer over the structure of FIG. 5.
Figure 7:
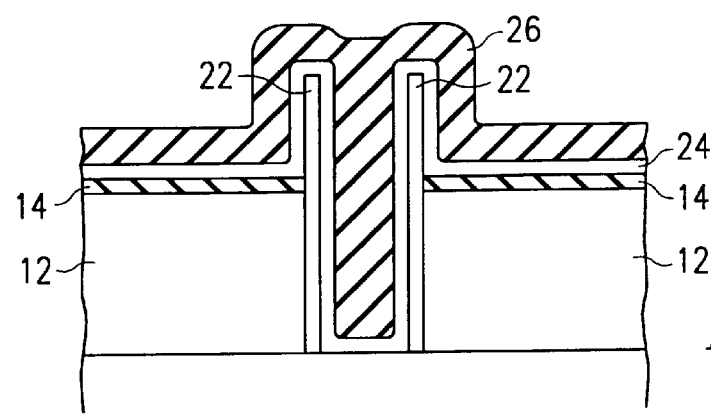
FIG. 7 shows a deposition of an oxide layer onto the structure of FIG. 6.
Figure 8:
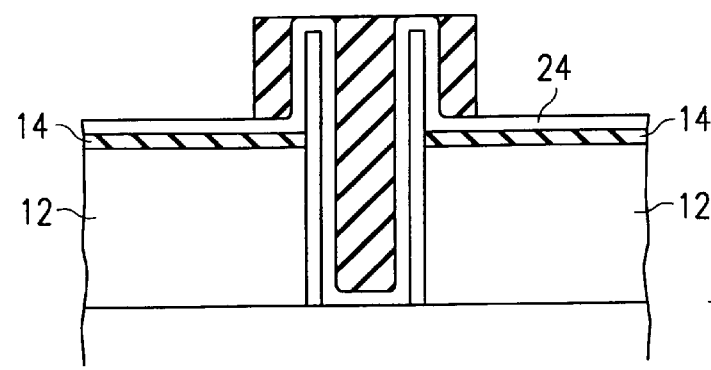
FIG. 8 shows the structure of FIG. 7 after an oxide etching.

As shown in FIG. 6, a second conductive layer 24 is deposited along the exposed etch stop layer 14, the via 18, the first crown 22 wall surfaces, and first crown base 23 to provide contact between the bottom of the via 18, the first crown 22 and the second crown 30. A second sacrificial layer 26, or spacer layer 26, is then grown onto the second conductive layer 24 to fill via 18 and to act as a spacer between consecutive crowns. The spacer layer 26 can comprise doped or undoped $SiO_2$ deposited using a CVD or plasma CVD deposition process. The spacer layer 26 is then etched back to expose the second conductive layer 24 and the spacer layer 26 in particular areas as shown in FIG. 8.

Figure 9:
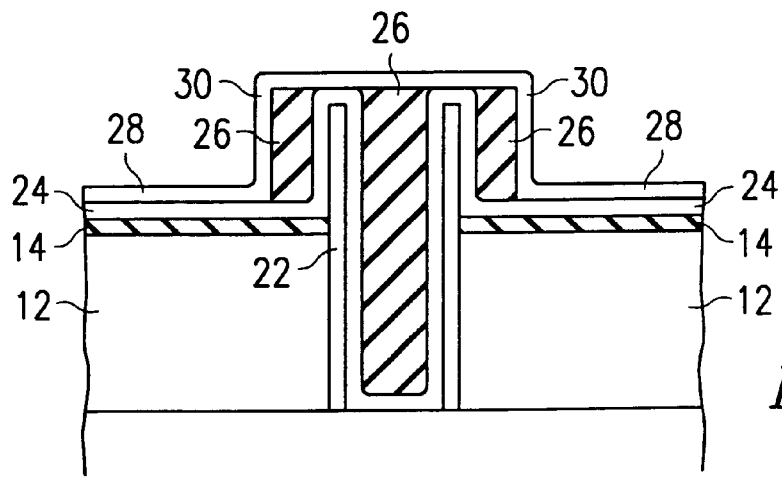
FIG. 9 shows the deposition of a conductive layer onto the structure of FIG. 8.
Figure 10:
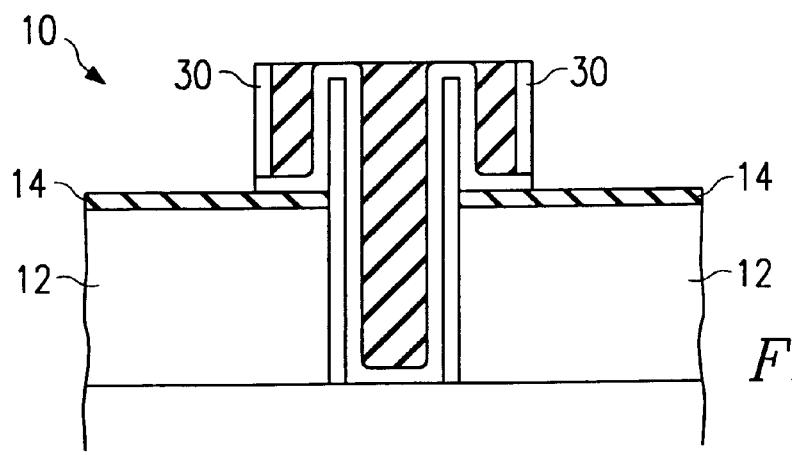
FIG. 10 shows the structure of FIG. 9 after a conductive material etching.
Figure 11:
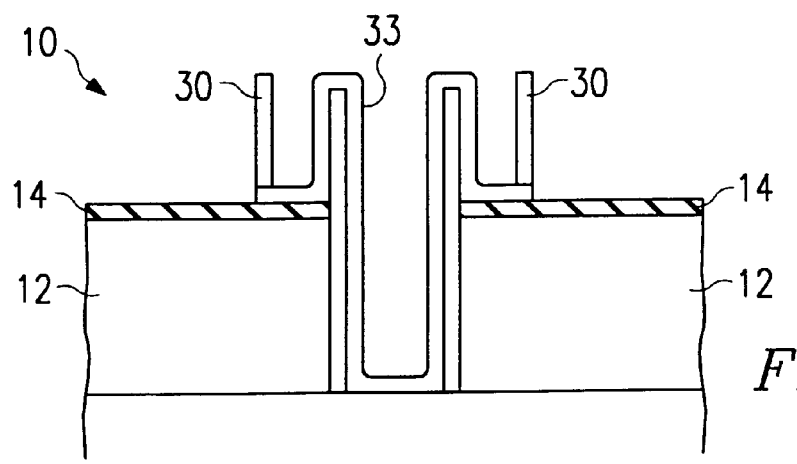
FIG. 11 shows a selective etching of oxide resulting in one embodiment of a multiple crown storage cell according to the present invention.

A third conductive layer 28 is then deposited along the exposed portions of the spacer layer 26 and the second conductive layer 24 to form the second crown 30 as shown in FIG. 9. An etch-back process is then applied to the structure of FIG. 9 to etch off the third conductive layer 28 connection on top of the storage cells and the bottom conductive layer (polysilicon) connection between the storage cells to define the second crown 30 and the multiple crown storage cell 10 as shown in FIG. 10. The remaining oxide spacer layer 26 is then etched back to provide a self-aligned double crown storage cell structure 10 according to the teachings of the present invention, as shown in FIG. 11. In an alternative embodiment, a conductive layer etch-back process can be performed on the third conductive layer 28 until the spacer layer 26 and second conductive layer 24 are exposed. The oxide spacer layer 26 can then be etched back, followed by an etch-back of the second conductive layer 24 and removal of the remaining etch stop layer 14 to provide a double crown storage cell structure 10. The process described in FIGS. 6 through 11 can be repeated multiple times to grow additional crowns.

Similarly to first crown 22, the third conductive layer 28 forms second crown 30 above via 18 and second crown base 33 within via 18. Second crown 30 is formed peripherally around first crown 22, and is spaced apart from first crown 22 by the distance defined by spacer 26. Second crown base 33 is formed within via 18 to provide a structure that gives second crown 30 an increased mechanical stability both during and post manufacture.

The fabricated double crown storage cell structure 10 of the FIG. 11 embodiment has larger cell size than previously developed 256M storage cells because the self-aligned double crown storage cell 10 can have smaller cell separation than the previously proposed storage cells with one via and one SN pattern. For example, the total surface area of the double crown storage cell 10 of FIG. 11 can be approximately 3.2 times the size of a simple stacked cell (STC) at an SN height of 0.5 µm.

In one embodiment, the conductive layer etch-back process used to etch each conductive layer can comprise using an AMAT P-5000 etcher to roughen the surface of the polysilicon layers and further increase the double crown storage cell 10 surface area as compared to smooth double crown cells. Furthermore, it is possible to extend use of this self-aligned multiple crown storage cell 10 to 1 Gb DRAMs if the total surface area of the multiple crown storage cell 10 is increased by using a smaller via and narrower spacers to form triple crown cell, or if the conductive layer (e.g., polysilicon) etch process results in a ruggedpolysilicon surface in conjunction with a double crown cell. The storage cell structure of the present invention forms a multiple crown capacitor upon a deposition of an appropriate dielectric and formation of a top plate.

Figure 12:
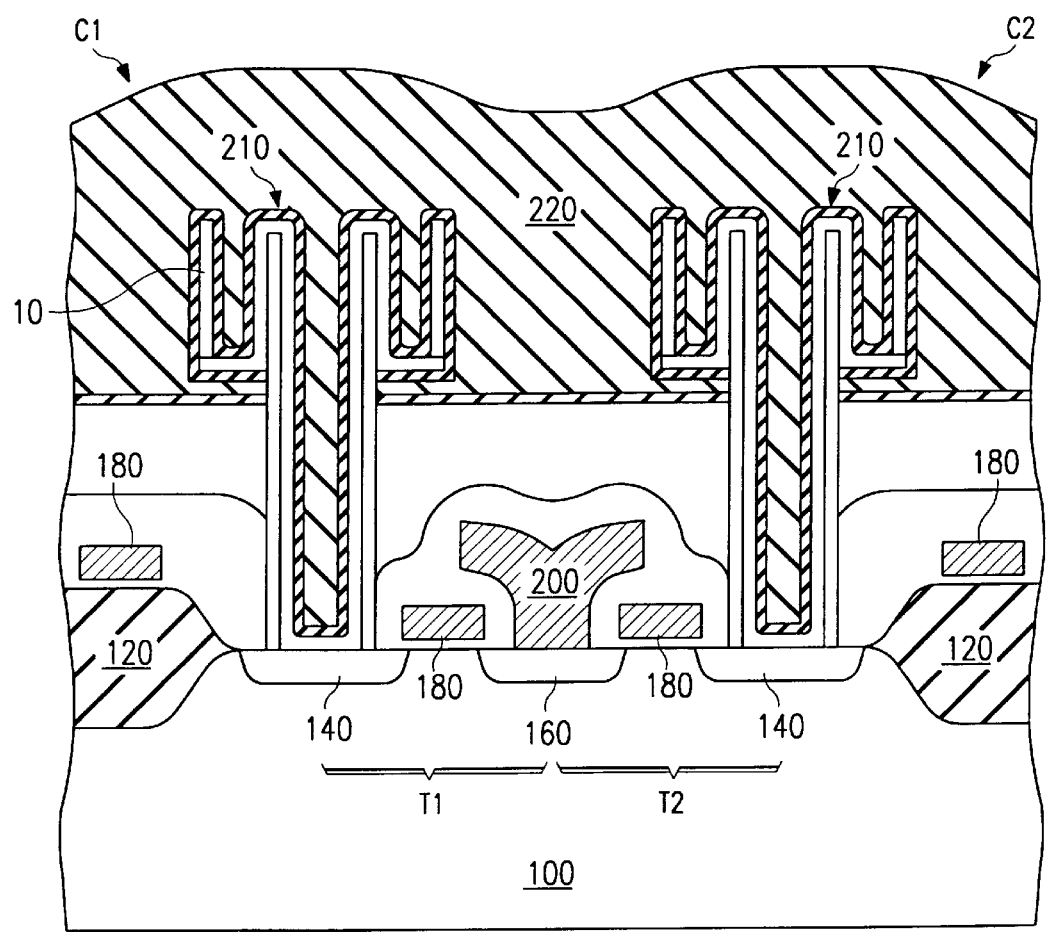
FIG. 12 shows a DRAM cell incorporating two double-crown storage capacitors according to the teaching of the present invention.

FIG. 12 shows a DRAM cell incorporating two double-crown storage cell structure embodiments of the present invention. In FIG. 12, the memory cellplanarizing layer 12 has been formed on a semiconductor substrate 100 upon which a pair of transistors have been formed. Each transistor has a source region 140 and a gate electrode 180, while commonly sharing a drain region 160 and the connected bit line 200. Bit line 200 and drain region 160 are formed on an active region of the semiconductor substrate 100 which is divided into active and isolated regions by field oxide 120. An insulating layer 190 can be formed over the entire surface of the resultant structure to insulate the transistors. The planarizing layer 12 can serve the function of an insulating layer 190. The multiple-crown storage cell structure 10 is then formed on the resultant structure by the process described in FIGS. 1–11 and associated text. The transistors couple the storage node contact to the bit line 200. A dielectric material 210, such as O/N/O, is then deposited onto the entire surface of the multiple crown storage cell structure 10. A top plate material, such as an impurity-dopedpolysilicon, is deposited on the dielectric material 210 to form a top plate 220. The resulting DRAM cell structure incorporates two double-crown storage capacitors 240 and 250.

In summary, the present invention provides a self-aligned multiple crown storage cell structure, and method of formation, for use in a semiconductor memory device to provide a storage capacitor with increased capacitance. In one embodiment, a double crown storage cell structure can be formed by patterning a contact via into a planarized insulating layer/etch stop layer/hard mask layer stack-up, depositing a first conductive layer, etching the first conductive layer, etching the hard mask layer, depositing a second conductive layer onto the conductive layer patterned via and the etch stop layer, depositing an oxide layer onto the second conductive layer, etching the oxide layer, depositing a third conductive layer, etching conductive layer material (such as polysilicon) to expose the etch stop layer, and etching the remaining oxide layer. The last several steps can be repeated to form a storage cell structure with three or more crowns. The self-aligned multiple crown storage cell of the present invention provides an increased storage cell surface area, and thus an increased charge storage capacity, within a given memory array surface area. The formation methodology of the present invention eliminates a photo pattern level and provides a more robust formation process and a storage cell that has increased mechanical stability.

Although the present invention has been described in detail, it should be understood that various changes, substitutions and alterations can be made hereto without departing from the spirit and scope of the invention as described by the appended claims.

What is claimed is:

1. A method for forming a self-aligned multiple crown storage cell structure for use in a semiconductor memory device, comprising:
   providing a planarized base layer;
   patterning a contact via into the base layer;
   forming a first sacrificial layer on the base layer;
   depositing a first conductive layer onto the patterned via and the first sacrificial layer;
   etching the first conductive layer to expose the first sacrificial layer;
   removing the first sacrificial layer;
   depositing a second conductive layer onto the conductive material-coated patterned via and also on the base layer;
   depositing a second sacrificial layer onto the second conductive layer to fill the via;
   etching the second sacrificial layer to expose portions of the second conductive layer;
   depositing a third conductive layer onto the exposed portions of the second conductive layer and the remaining second sacrificial layer;
   performing an etch of the conductive layer to expose portions of the base layer; and
   removing remaining portions of the second sacrificial layer to form a double crown storage cell structure.

2. The method of claim 1, wherein both the first sacrificial layer and the second sacrificial layer comprise an oxide.

3. The method of claim 1, wherein the base layer further comprises an etch stop layer.

4. The method of claim 1, further comprising:
   depositing a fourth conductive layer onto the conductive material-coated patterned via and the base layer;
   depositing a third sacrificial layer onto the fourth conductive layer;
   etching the third sacrificial to expose portions of the fourth conductive layer;
   depositing a fifth conductive layer onto the exposed portions of the fourth conductive layer and the remaining third sacrificial layer;
   performing an etch to expose the base layer; and
   etching the remaining third sacrificial layer, thereby forming a three crown storage cell structure.

5. The method of claim 1, further comprising:
   depositing a fourth conductive layer onto the conductive material-coated patterned via and the base layer;
   depositing a fourth sacrificial layer onto the fourth conductive layer;
   etching the fourth sacrificial layer to expose portions of the fourth conductive layer;
   depositing a fifth conductive layer onto the exposed portions of the fourth conductive layer and the remaining fourth sacrificial layer;
   etching conductive material to expose the base layer; and
   etching the remaining fourth sacrificial layer;
   depositing a sixth conductive layer onto the conductive material-coated patterned via and the etch stop layer;
   depositing a fifth sacrificial layer onto the sixth conductive layer;
   etching the fifth sacrificial layer to expose portions of the sixth conductive layer;
   depositing a seventh conductive layer onto the exposed portions of the sixth conductive layer and the remaining fifth sacrificial layer;
   etching conductive material to expose the base layer; and
   etching the remaining fifth sacrificial layer, thereby forming a four crown storage cell structure.

6. The method of claim 1, wherein etching conductive material to expose the base layer further comprises:
   etching the third conductive layer to expose the remaining second sacrificial layer and a portion of the second conductive layer; and
   etching the exposed portion of the second conductive layer to expose the base layer.

7. The method of claim 1, wherein the base layer further comprises an insulating layer formed from an oxide and an the etch stop layer comprising $Si_3N_4$ deposited onto the insulating layer.

8. The method of claim 1, wherein each conductive layer comprises polysilicon deposited using chemical vapor deposition.

9. The method of claim 1, wherein the second sacrificial layer comprises $SiO_2$ deposited using chemical vapor deposition.

10. The method of claim 1, further comprising depositing a dielectric onto the storage cell structure and depositing a top plate over the dielectric to form a multiple crown storage capacitor.

* * * * *